United States Patent [19]

Dobbs et al.

[11] Patent Number: 5,271,702
[45] Date of Patent: Dec. 21, 1993

[54] ROBOTIC SUBSTRATE MANIPULATOR

[75] Inventors: Michael E. Dobbs, Brighton; Donald B. Jones, Ann Arbor, both of Mich.

[73] Assignee: Environmental Research Institute of Michigan, Ann Arbor, Mich.

[21] Appl. No.: 829,719

[22] Filed: Feb. 3, 1992

[51] Int. Cl.⁵ ............................................. B65G 49/07
[52] U.S. Cl. ................................... 414/223; 414/217; 414/226; 414/331; 414/416; 414/937; 414/939; 414/941; 901/17
[58] Field of Search .............. 414/217, 223, 277, 280, 414/416, 744.3, 744.8, DIG. 3, DIG. 4, DIG. 5, 331, 787, 226, DIG. 7; 312/268; 901/6, 17, 18

[56] References Cited

U.S. PATENT DOCUMENTS

| | | | |
|---|---|---|---|
| 4,403,907 | 9/1983 | Koller et al. | 414/744.3 |
| 4,500,407 | 2/1985 | Boys et al. | 414/416 X |
| 4,502,830 | 3/1985 | Inaba et al. | 414/744.3 X |
| 4,770,590 | 9/1988 | Hugues et al. | 414/744.3 X |
| 4,778,382 | 10/1988 | Sakashita | 414/DIG. 5 X |
| 4,797,564 | 1/1989 | Ramunas | 901/17 X |
| 4,818,169 | 4/1989 | Schram et al. | 414/744.3 X |
| 4,844,679 | 7/1989 | Teranishi | 414/280 X |
| 4,981,409 | 1/1991 | Hirose et al. | 414/280 X |
| 5,044,871 | 9/1991 | Davis et al. | 414/416 X |
| 5,133,635 | 7/1992 | Malin et al. | 414/744.8 |

FOREIGN PATENT DOCUMENTS

| | | | |
|---|---|---|---|
| 0041129 | 2/1987 | Japan | 414/DIG. 3 |
| 0259932 | 11/1987 | Japan | 414/DIG. 3 |
| 0137448 | 6/1988 | Japan | 414/416 |

Primary Examiner—David A. Bucci
Assistant Examiner—James Keenan
Attorney, Agent, or Firm—Krass & Young

[57] ABSTRACT

A robotic substrate manipulator constructed for substrate handling during thin film deposition in the vacuum of outer space. The robotic substrate manipulator includes a cassette holding a plurality of substrates preferably including six cassettes in a carousel. A circular cylinder encloses the carousel with an access door at a location accessible by a manipulator arm assembly. Substrates are retained within the cassette via a passive retention system. This manipulator arm assembly includes an arm with a gripper at one end. The gripper includes a pair of opposed fingers normally urged closed by at least one finger spring that may be opened by a solenoid. The manipulator arm assembly includes a vertical driver and a horizontal rotary driver permitting motion of substrates from the cassette to a processing station. Position gauges on both the vertical motion driver and the horizontal rotary motion driver permit feedback regarding the manipulator arm assembly position. In the preferred embodiment the processing station employs the vacuum of space in thin film deposition.

39 Claims, 5 Drawing Sheets

ROBOTIC SUBSTRATE MANIPULATOR

The invention of this application was supported in part by grant no. NAGW-1198 awarded by the National Aeronautics and Space Administration. The United States government has certain rights in this application.

TECHNICAL FIELD OF THE INVENTION

The technical field of the present invention is that of substrate processing for semiconductors, superconductors or the like, and more particularly that of robotic handling of substrates.

BACKGROUND OF THE INVENTION

There are many applications in the fields of semiconductor and superconductor manufacturing where processing in a vacuum is advantageous. One example of such vacuum processing is the production of thin films via vacuum deposition. The quality of the thin film thus produced depends upon the quality of the vacuum used. This makes thin film deposition suited to manufacture in space where a vacuum of better quality than obtainable on earth is readily available.

Thin film deposition in space has problems. Typical thin film deposition on earth requires many highly skilled operators and technicians to control the processes. These personnel also manually manipulate the substrates between various processing locations. Space processing of thin films using such personnel would be too expensive because of the high launch and support costs for these personnel. Thus some automated substrate manipulation is needed to make space thin film deposition economical.

Terrestrial robotic substrate handling systems generally employ a combination of suction and gravity to control the substrates. These techniques cannot be used in space because of the surrounding vacuum and the lack of gravity. Thus it would be useful to provide a robotic substrate manipulator capable of operating in space in order to take advantage of the readily available high quality vacuum.

SUMMARY OF THE INVENTION

This invention is a robotic substrate manipulator constructed for substrate handling during processing in the vacuum of outer space. The robotic substrate manipulator is particularly suited for thin film vacuum deposition. The robotic substrate manipulator is disposed in a canister forming a single replaceable unit. The robotic substrate manipulator includes a cassette holding a plurality of substrates disposed in locations in a stacked relationship having a predetermined height along at least one stack axis. The robotic substrate manipulator preferably includes a set of six cassettes disposed in a carousel.

The cassette retains substrates via a passive retention system. At least one, and preferably two, fixed holders engage the edge of any substrate disposed in a substrate holding location. A movable holder also engages the edge of the substrate. A holding spring urges this movable holder in a direction perpendicular to the edge of the substrate. A substrate retained by the movable holder via the holding spring may be removed by overcoming the holding spring.

A circular cylinder encloses the carousel. This cylinder includes an access opening at a location accessible by a manipulator arm. A motor permits rotation of the carousel.

A manipulator arm transports the substrates. This manipulator arm includes an arm assembly with a gripper at one end. The gripper may grip and hold a substrate. The gripper includes a pair of opposed fingers normally urged closed by at least one finger spring. A solenoid when energized overcomes the spring to open the opposed fingers. Preferably, the gripper employs a lever action from the springs to the opposed fingers.

A vertical driver coupled to the arm assembly opposite the gripper moves the arm assembly parallel to the stack axis. The range of movement of the vertical driver includes at least the full height of the cassette. This vertical driver preferably includes a ball screw assembly but may include a rack and pinion gear system.

A horizontal rotary driver rotates the arm assembly about a pivot axis. The horizontal rotary driver has a range of rotation including at least a first position where the gripper may grip a substrate disposed in the cassette and a second position where any substrate held by the gripper is clear of the cassette. The range of horizontal rotary motion also includes the location of the processing station.

The processing station retains a single substrate for processing. In the preferred embodiment this processing station employs the vacuum of space in thin film deposition. In the preferred embodiment a door isolates the processing station from the storage locations. The preferred embodiment also maintains the stored substrates in vacuum, even during launch and recovery. Thus this door must maintain a vacuum seal whenever the external environment is not the vacuum of space.

BRIEF DESCRIPTION OF THE DRAWINGS

These and other objects and aspects of the present invention will become clear from the following description of the invention, in which.

DETAILED DESCRIPTION OF THE PREFERRED EMBODIMENTS

Figure 1:
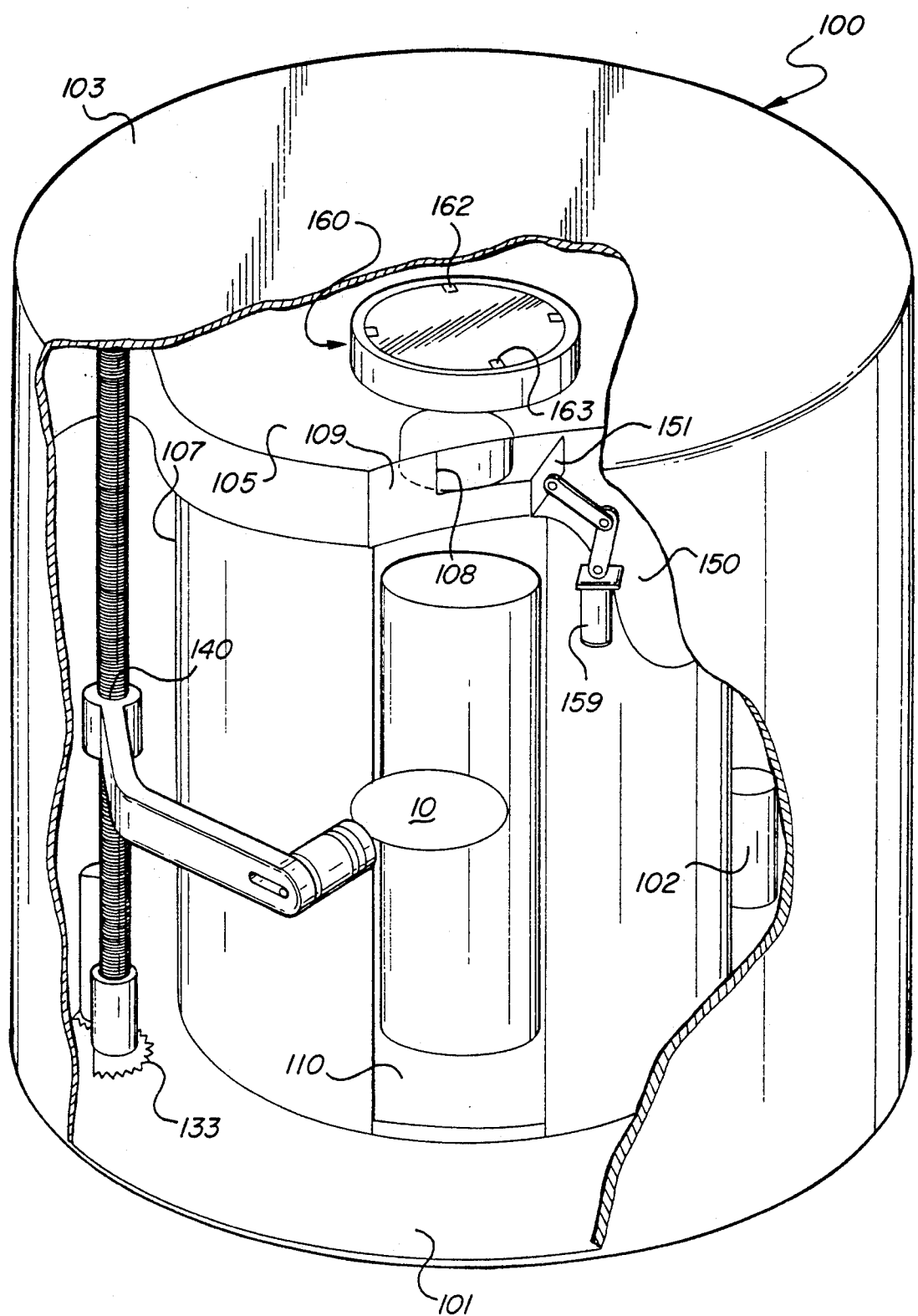
FIG. 1 is a perspective view of the robotic substrate manipulator of this invention.

FIG. 1 illustrates the robotic substrate manipulator of the present invention. Robotic substrate manipulator 100 is preferably constructed of low off gassing materials such as stainless steel, teflon and the like. Reduction in volatile material reduces the amount of contaminants present during the vacuum processing. The mechanical actions of the robotic substrate manipulator 100 preferably occur at low speeds, low friction and low shear. This serves to reduce potentially contaminating particles generated during operation. It is preferable that no conventional hydrocarbon lubricants be employed and thus that the robotic substrate manipulator 100 be designed for a limited life span. Alternatively, some motors and movements may employ hydrocarbon lubricants and be enclosed in sealed bellows. As a further alternative, dry lubricants not including hydrocarbons may be used. All these features serve to preserve the quality of the vacuum.

Robotic substrate manipulator 100 includes a base plate 101, a top plate 103 and an intermediate plate 105. A cassette carousel 110 is mounted between base plate 101 and intermediate plate 105 within cylinder 107. A motor 102 rotates cassette carousel 110. Cassette carousel 110 holds the substrates before and after processing. Robotic substrate manipulator 100 includes a door 151. Door 151 is disposed to selectively close opening 108 in wall 109. Door 151 is disposed between the substrate storage region and the processing station that may be opened and closed by door operator 150. A manipulator arm assembly 130 transports individual substrates between the cassette carousel 110 and a processing station 160. Processing station 160 is mounted on intermediate plate 105 and holds a single substrate during vacuum processing. In the preferred embodiment this vacuum processing is thin film deposition.

In the preferred embodiment the substrates are kept in vacuum during the entire processing cycle. Substrates are loaded into cassette carousel 110 in vacuum and sealed by door 151. Door 151 provides a vacuum seal between the substrate storage in cassette carousel 110 and processing station 160. Processing station 160 is vented to the environment. After launch when the environment is vacuum, door 151 may be opened to allow insertion and removal of substrates without compromising the vacuum storage of the substrates. Door 151 is sealed for recovery to preserve the vacuum. Terrestrial processing of semiconductor substrates in vacuum is known. Known vacuum processing techniques are used to load and remove substrates from cassette carousel 110. Storing the substrates in vacuum is advantageous in this system because it reduces the possibility of contamination during launch and recovery.

Cassette carousel 110 preferably includes six vertical stacks of substrate holders disposed in a circle. Motor 102 rotates cassette carousel 110 so that the desired stack is in the position for loading. Manipulator arm assembly 130 moves vertically to the position of the desired substrate and rotates horizontally to access the desired substrate. Manipulator arm assembly 130 may also access the processing station 160 by vertical movement above top plate 103 and horizontal rotation to this location.

Figure 2:
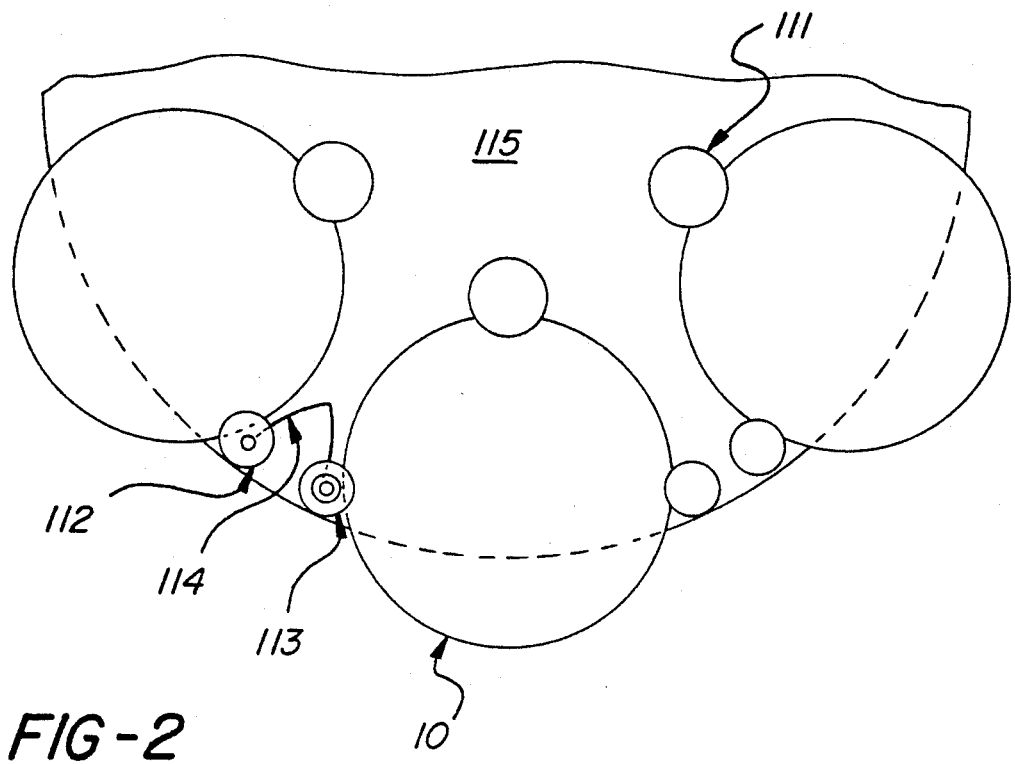
FIG. 2 is a view of the substrate cassette carousel of this invention.

FIG. 2 illustrates in partial cut away form details of one layer of cassette carousel 110. Cassette carousel 110 holds plural substrates 10. Each layer includes a circular platter 115. For each substrate 10 held by cassette carousel 110, platter 115 includes fixed holders 111 and 112 and a movable holder 113. Spring 114 urges movable holder 113 into contact with the edge of substrate 10. During launch and recovery of the robotic substrate manipulator 100, fixed holders 111 and 112 and movable holder 113 retains substrate 10 with the aid of spring 114. Note that this process requires that fixed holder 112 and movable holder 113 subtend more than the diameter of substrate 10. During insertion of a substrate 10 into the retaining location, the insertion force overcomes spring 114 permitting the substrate to slide into the retaining location. Once the diameter passes between fixed holder 112 and movable holder 113, spring 114 helps push the substrate into the final retained location in contact with fixed holder 111. The reverse is true of removing substrate 10. Initial removal force overcomes spring 114 permitting removal of substrate 10.

Figure 3:
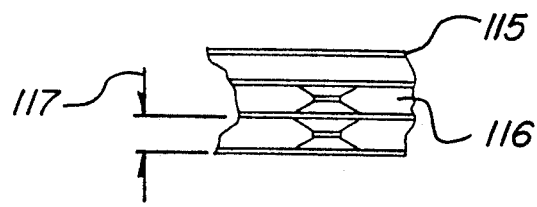
FIG. 3 is a detailed view of the substrate holders used in the substrate cassette of this invention.

FIG. 3 better illustrates the construction of fixed holders 111 and 112. Each holder is disposed between a pair of platters 115. Each holder has a circular saddle shape that guides the edge of a substrate toward the central narrowed portion 116. The height 117 of these holders is preferably about 0.250 inches.

Figure 4:
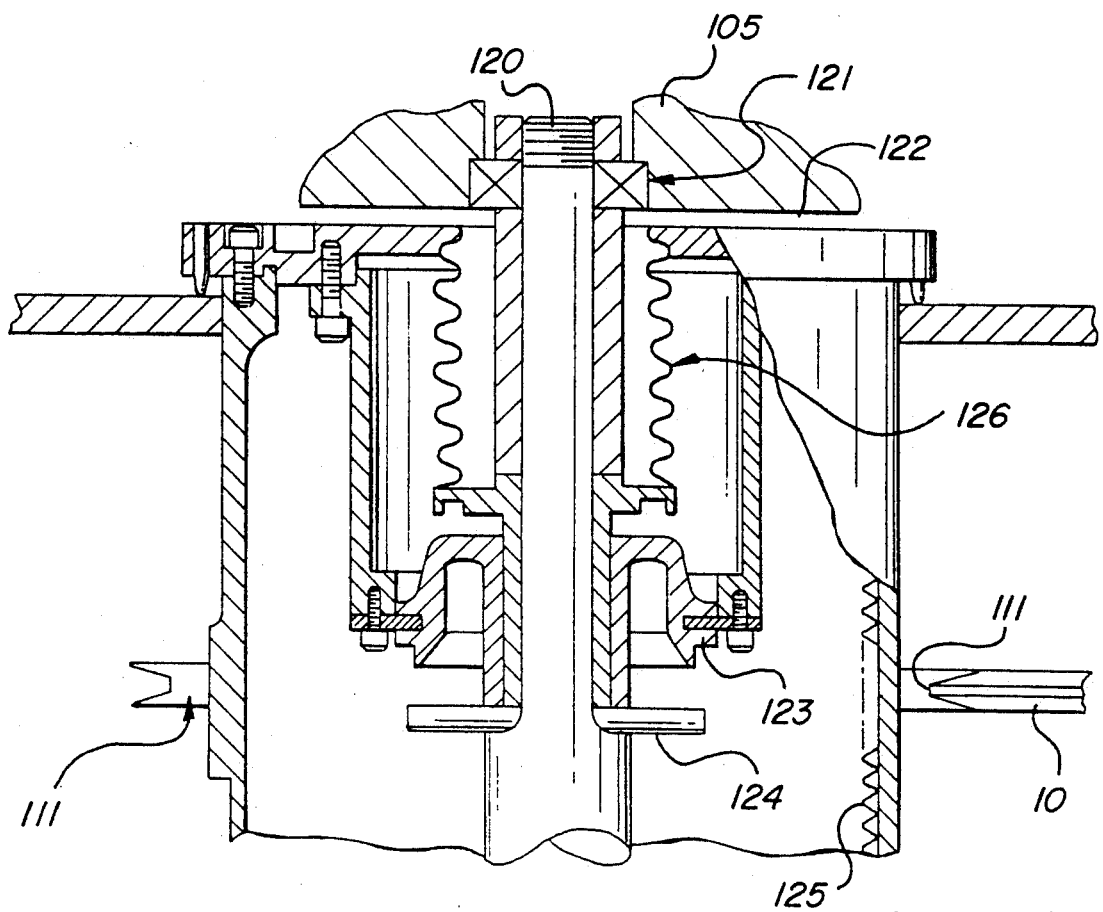
FIG. 4 is a detailed view of the anti-vibration bearings of the substrate cassette carousel of this invention.

FIG. 4 illustrates in cut away form the upper anti-vibration bearings used with cassette carousel 110. Bearings 121 hold carousel shaft 120 within intermediate plate 105. Bearings 121 preferably includes ceramic balls in carbide races. Cassette carousel 110 is suspended from carousel shaft 120 with a gap 122. This suspension is via isolator 123 that mounts on snubbing washer 124. Isolator 123 is preferably formed of an elastomeric material such as rubber. This provides a resilient mount to cassette carousel 110. Such a resilient mount is needed to isolate substrates 10 from vibrations transmitted through the frame during launch and recovery. Additional dampening material 125 may be applied to the interior walls of the inner cylinder. Optional bellows 126 serves to reduce outgassing from the interior parts of cassette carousel 110. As previously mentioned, minimizing such outgassing enhances the quality of the final vapor deposition product.

Cassette carousel 110 must be rotatable to provide access to all the substrates. Cassette carousel 110 may be rotated by motor 102 attached to carousel shaft 121, either on the upper bearing assembly illustrated in FIG. 4, or more preferably on the substantially identical lower bearing assembly. As an alternative, cassette carousel 110 may be rotated by a Geneva drive assembly that provides stops for access to each substrate stack.

Figure 5:
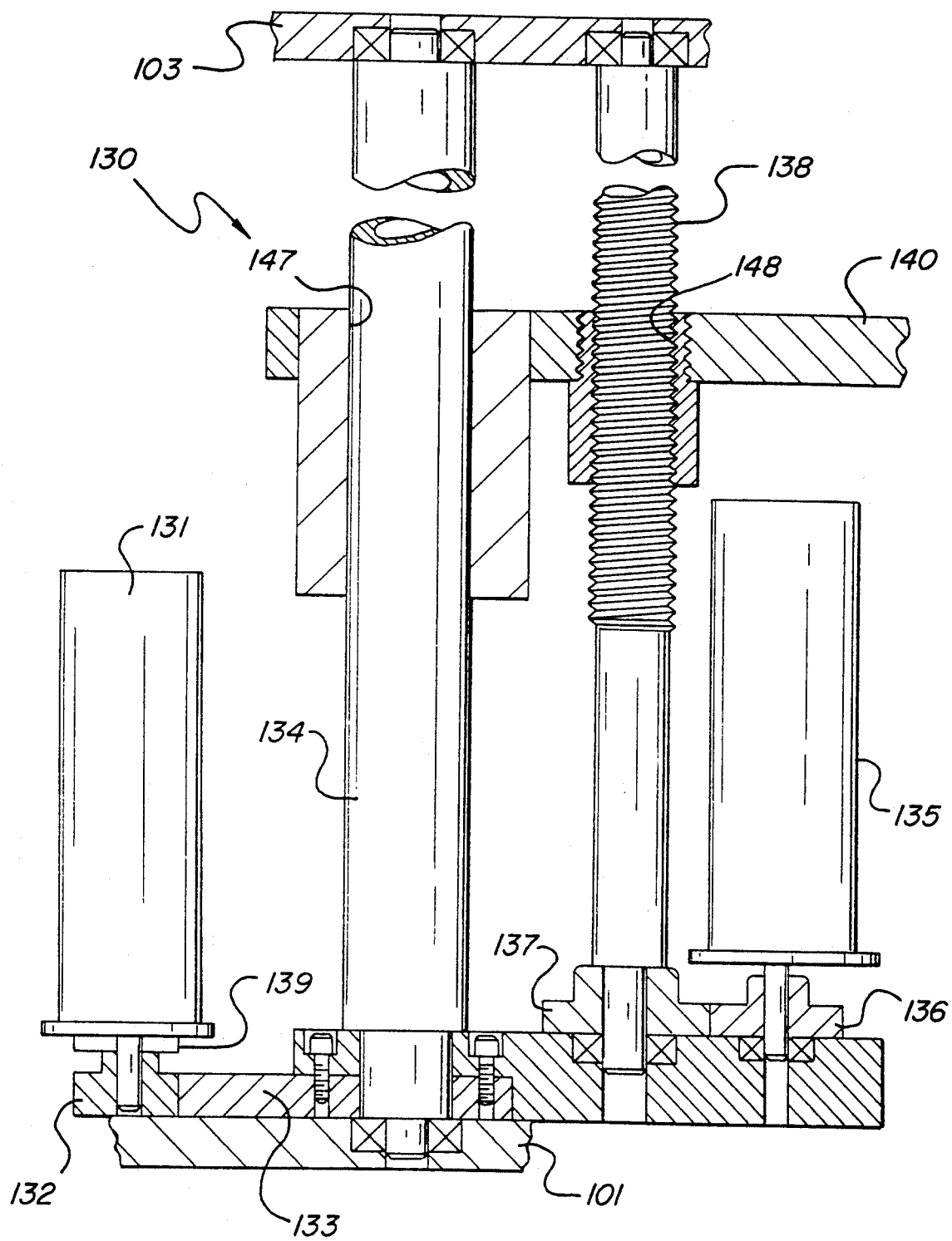
FIG. 5 is a detailed view of the drive mechanism for the rotary arm of this invention.

FIG. 5 illustrates the horizontal rotary motion driver of the manipulator arm assembly 130 mounted on base plate 101. A motor 131 drives a small spur gear 132, which in turn drives semicircular spur gear 133. Semicircular spur gear 133 is better illustrated in FIG. 1. Semicircular spur gear 133 rotates about vertical shaft 134 that is retained in bearings in the base plate 101 and the top plate 103. Arm 140 includes opening 147 that accommodates shaft 134. Rotation of semicircular spur gear 133 causes horizontal rotation of arm 140 about shaft 134. In operation, motor 131 operates bidirectionally to rotate semicircular spur gear 133. Arm 140 is similarly rotated about shaft 134. This horizontal rotary motion permits arm 140 to insert or remove a substrate from cassette carousel 110 or from processing station 160.

The horizontal rotary motion driver of manipulator arm assembly 130 preferably includes a manner of detecting the arm's rotary position. Manipulator arm assembly 130 preferably includes a conventional shaft encoder coupled to the drive shaft of motor 131. This permits determination of when the rotary position of arm 140 coincides with the major rotary positions of insertion or removal of a substrate from cassette carousel 110 and insertion or removal of a substrate from processing station 160.

Manipulator arm assembly 130 preferably includes some manner of detecting the insertion force of arm 140. FIG. 5 illustrates rotary strain gauge 139 that detects the strain on the shaft of motor 131. This provides a measure of the insertion force applied to substrate 10. Knowing the force applied to substrate 10 enables an insertion operation to be aborted before damaging a substrate. Those skilled in the art would realize that there are many other places in the system where force can be measured to provide an indication of the insertion force applied to substrate 10, such as the shaft 134 or between gripper 141 and arm 140.

Figure 6:
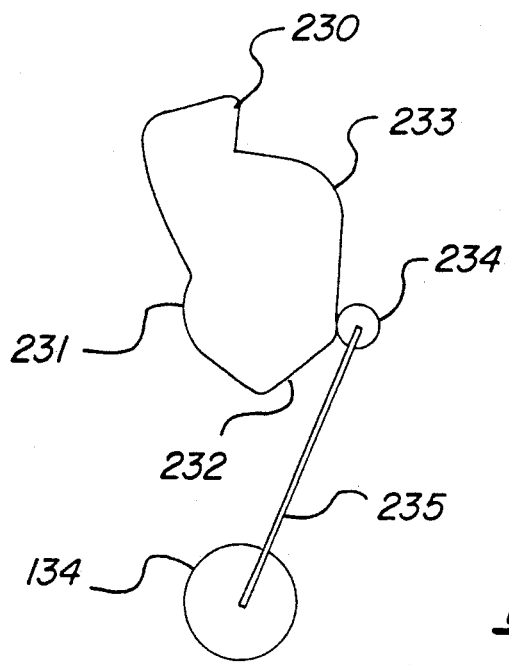
FIG. 6 is a top view of an alternative drive mechanism for the rotary arm of this invention.

FIG. 6 illustrates an alternative embodiment of the horizontal rotary motion driver of manipulator arm assembly 130. In this alternative embodiment an accurately machined cam 230 substitutes for both semicircular spur gear 133 and the shaft encoder. Cam 230 may be directly driven by motor 131 or driven via a conventional reduction gear. Cam 230 includes three positions. When cam 230 rotates to the first position 231, cam follower 234 rotates shaft 134 to the rest position via lever 235. In this rest position manipulator arm 130 is out of the way of cassette carousel 110. This rest position is also used during up and down motion of manipulator arm assembly 130. In the second position 232, cam follower 234 rotates shaft 134 placing manipulator arm assembly 130 in position to insert or withdraw a substrate from cassette carousel 110 Lastly, cam position 233 permits manipulator arm assembly 130 to insert or remove a substrate from processing station 160. The use of cam 230 with broad tolerances in the region of the three positions eliminates the need for a system to determine accurately the manipulator arm rotary position. Those skilled in the art would realize that other mechanisms are capable of controlling the horizontal motion of manipulator arm assembly 130.

FIG. 5 illustrates the vertical motion driver of manipulator arm assembly 130. Motor 135, which is mounted on semicircular spur gear 133, drives gear 136. Gear 136 drives gear 137 and screw shaft 138. Rotation of screw shaft 138 moves arm 140 vertically via threaded hole 148. Arm 140 supports a gripper located at its distant end (not illustrated in FIG. 5, see FIG. 7). Though a screw assembly is illustrated here, those skilled in the art would realize that other techniques, such as a rack and pinion, could be used for vertical motion of arm 140.

The vertical driver of manipulator arm assembly 130 preferably includes a manner of detecting the arm's vertical position. Manipulator arm assembly 130 preferably includes a conventional shaft encoder coupled to the drive shaft of motor 135. This permits determination of when the vertical position of arm 140 coincides with the various substrate storage location in cassette carousel 110 and with the processing station 160. Alternatively, a linear encoder may be mounted to detect the vertical position of manipulator arm 130. The important feature is that the vertical position of manipulator arm 130 is monitored to determine when manipulator arm 130 is opposite a substrate storage location within cassette carousel 110 or opposite processing station 160.

Figure 7:
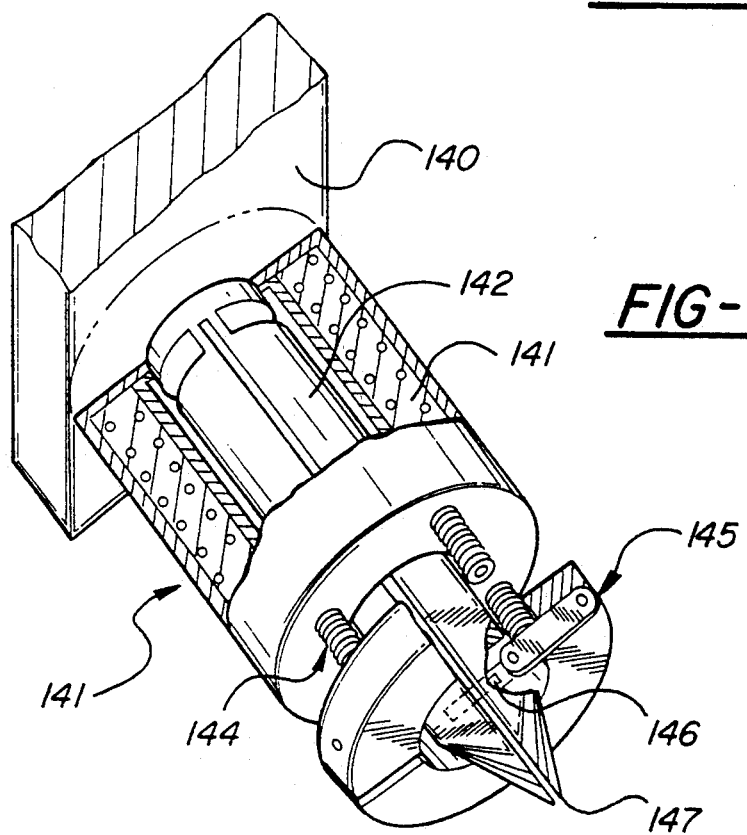
FIG. 7 is a detailed view of the substrate gripper of this invention.

FIG. 7 illustrates in partial cut away form gripper 141 disposed at the distant end of arm 140. Gripper 141 selectively holds substrates for transportation between cassette carousel 110 and processing station 160. Note that the illustration of FIG. 7 has a different orientation from that of FIG. 1 for clarity of illustration. The gripper 141 is mounted on arm member 140. A gripper bar 142 consisting of a split cylinder is disposed within a solenoid coil 143. Under passive conditions, compression springs 144 and compression links 145 (only one of two required illustrated here) cooperate via roll pin stop 146 to force jaws 147 closed. This provides passive force for gripping substrates 10. Compression springs 144 set this passive force. Electrical excitation of solenoid coil 143 permits the split cylinder of gripper bar 142 to open jaws 147 equally from both sides of the substrate. Electrical excitation is required only when opening jaws 147. A substrate held by gripper 141 is retained even during temporary loss of electric power.

Door operator 150 opens and closes door 151. Door 151 separates the substrate storage area including cassette carousel 110 from the processing station 160. When door 151 is closed the processing station is isolated from the substrate storage. This prevents contamination of the stored substrates. Door 151 selectively closes opening 108 in wall 109. Wall 109 is disposed between top plate 103 and intermediate plate 105 and follows a chord of the circle of intermediate plate 105. Opening 108 is disposed in a location permitting manipulator arm assembly 130 access to processing station 160.

Figure 8:
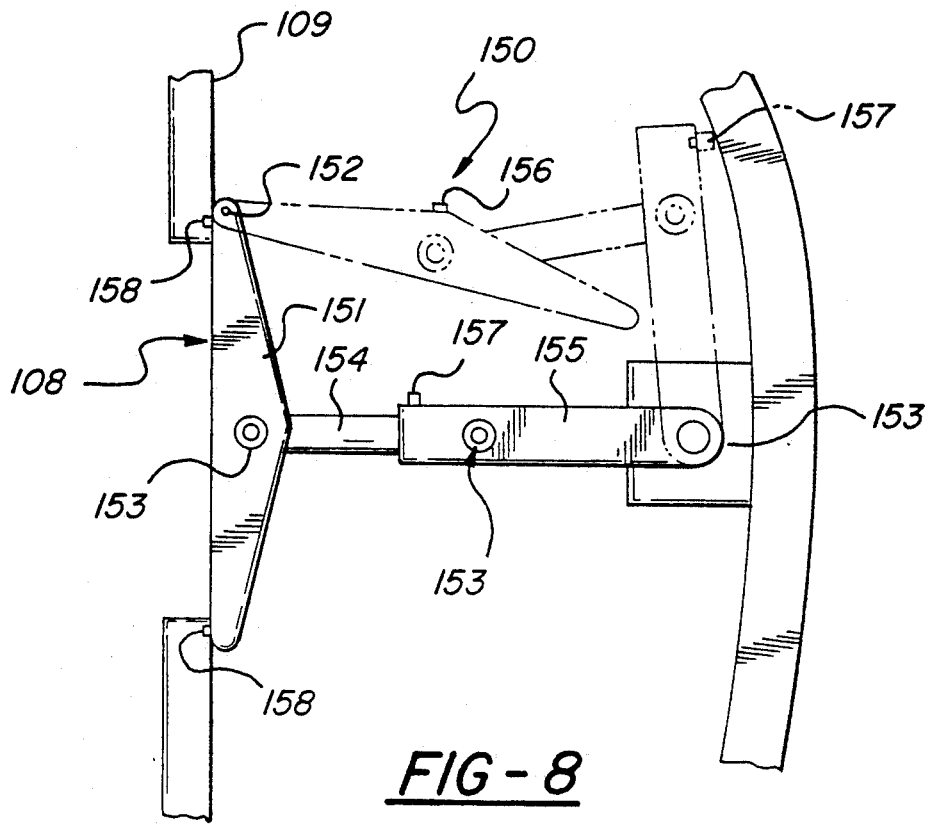
FIG. 8 is a detailed view of the processing station door of this invention.

Door 151 pivots on end pivot 152, which is disposed at one end of opening 108. Door 151 is opened and closed via motor 159 (not shown in FIG. 8, see FIG. 1) using arms 154 and 155 and intermediate pivots 153 for leverage. When closed door 151 and 0-ring seals 158 form a vacuum seal. FIG. 8 shows door 151 and arms 154 and 155 in dashed lines in the fully open position. In this fully open position manipulator arm assembly 130 has sufficient room to transport a substrate 10 through opening 108 to processing station 160. Arm 154 encounters a fixed stop 156 when door 151 is fully open. Arm 155 includes a further adjustable stop 157. Adjustable stop 157 is preferably an adjustable screw that controls the cam over position. Upon closing, motor 159 over rotates arm 155 past the in-line position, compressing O-rings 158. The resiliency of O-rings 158 and any pressure on the processing station side of opening 108 tends to rotate arms 154 and 155 past fully closed. Adjustable stop 157 stops this over rotation preventing the opening of door 151. This technique insures that when closed door 151 stays closed even if electric power is not available for motor 159.

Figure 9:
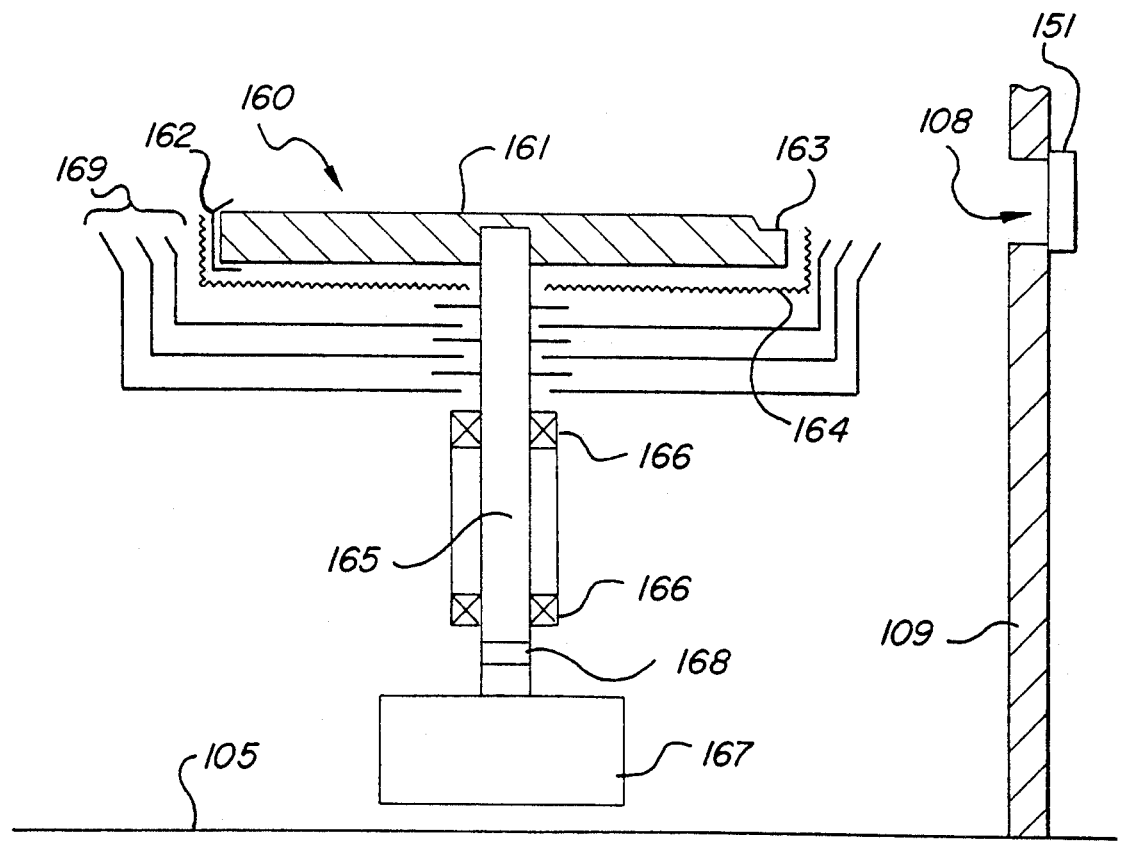
FIG. 9 is a detailed view of the thin film deposition station of this invention.

FIG. 9 illustrates the thin film disposition station of this invention. Those skilled in the art would realize that other processing could take place at this station and that thin film deposition is merely an example taking advantage of the available vacuum of space. Processing station 160 is preferably mounted on intermediate plate 105 opposite carousel 110. Manipulator arm assembly 130 transports substrates to processing station 160 by raising the arm to its fullest vertical extent above cylinder 103 and rotating the arm to its fullest counter-clockwise position.

Processing station 160 retains substrate 10 on heater block 161 in a manner similar to cassette carousel 110. Three tungsten springs 162 (only one illustrated in FIG. 9) retain the substrate. Heater block 161 includes a notch 163 that permits gripper 140 to load and unload substrates 10. This structure provides passive retention of substrates while permitting their easy insertion and removal. Heater coils 164 supply heat to heater block 161 to heat substrate 10.

Heater block 161 is mounted on shaft 165 for rotation during the vacuum deposition process. Shaft 165 is preferably formed of a ceramic and retained by ceramic bearings 166. Thermal insulator 168 connects shaft 165 to motor 167. Thermal insulator 168 protects motor 167 from heater coils 164. Plural shielding baffles 169 isolate the motor and drive assembly from the vapor deposition process. Shielding baffles 169 are preferably made of tantalum. Note that shielding baffles 169 do not rotate with heating block 161.

In use robotic substrate manipulator 100 operates as follows. Before use plural substrates to be processed are loaded into cassette carousel 110. In the preferred embodiment there are six cassettes disposed in a circular carousel. The capacity of cassette carousel 110 is primarily dependent upon the height. Cassette carousel capacities up to nearly 1000 substrates are contemplated. In the preferred embodiment the substrates are maintained in vacuum after loading into cassette carousel 110. Thus sealed and protected by the anti-vibration bearings of cassette carousel 110, the substrates and the robotic substrate manipulator are launched into space. The ambient vacuum is then employed in processing the substrates, such as thin film vacuum deposition.

Loading a substrate into the processing station includes the following steps:
1. Rotate carousel to desired cassette
2. Move manipulator arm vertically to desired substrate location
3. Open gripper
4. Rotate manipulator arm to cassette location overlapping substrate
5. Close gripper
6. Rotate manipulator arm out of carousel to transport position
7. Open processing station access door
8. Move manipulator arm vertically up to processing station location
9. Rotate manipulator arm into processing station inserting substrate
10. Open gripper
11. Rotate manipulator arm out of processing station
12. Close processing station access door
13. Initiate substrate processing Though the following set of steps are listed in a particular order, those skilled in the are would realize that this particular order is not required. As an example, no particular order of performance of steps 1 to 3 is required. If proper control circuitry is available the performance of some of these steps, such as steps 1 to 3 noted above, may occur simultaneously. Note also that the manipulator arm assembly may be lowered to the lowest position during substrate processing or some other location below top plate 103. In addition, the gripper may be closed once the substrate is placed in the processing station.

Unloading the processing station occurs in substantially the inverse order. This unloading includes the following steps:
1. Open processing station access door
2. Open gripper
3. Raise manipulator arm to height of process station
4. Rotate manipulator arm into process station
5. Close gripper
6. Rotate manipulator arm out of process station to transport position
7. Lower manipulator arm to clear process access door
8. Close processing station access door
9. Lower manipulator arm to level of desired substrate location
10. Rotate carousel to desired cassette
11. Rotate manipulator arm to cassette location
12. Open gripper
13. Rotate manipulator arm out of carousel to transport position
14. Close gripper As in loading the processing station, those skilled in the are would recognize that the order of certain steps is not important. It also should be noted that the substrate need not be returned to the same location within the cassette carousel after processing. The substrate may be retained in any other empty location if desired. Once processing of all the substrates is complete, door 151 is closed to preserve the vacuum within cassette carousel 110. The entire apparatus including the processed substrates may then be recovered from orbit and returned to earth.

This robotic substrate manipulator is ideally suited for unattended operation in outer space. The substrates may be resupplied and the processed substrates harvested using unmanned spacecraft. This unmanned spacecraft would be specifically designed for servicing such orbital factories. One manner or resupply and harvesting is the complete replacement of the whole apparatus with another apparatus having new substrates. For this reason the robotic substrate manipulator may be designed for a limited lifetime or a limited number of cycles. Thus this robotic substrate manipulator would be less expensive to manufacture than otherwise. Further, it could be constructed with less lubricants thereby preserving a better vacuum.

Though the primary contemplated use of this invention is in space manufacturing, those skilled in the art would realize that this invention has additional uses. As an example only, the robotic substrate manipulator could be used in handling biological slides. Then there would be no need to maintain a vacuum with cassette carousel 110. In other respects the robotic substrate manipulator of this invention would operate as described above.

We claim:

1. A robotic substrate manipulator comprising:
a cassette including a plurality of substrate holding locations disposed in a stacked relationship having a predetermined height along at least one stack axis, each substrate holding location capable of holding a single substrate;
a two-axis manipulator arm assembly including
an arm having a first end with a gripper thereon adapted to grip and hold a substrate and a second end opposite to said first end,
a vertical driver coupled to said arm proximate to said second end for selective movement of said arm parallel to said stack axis through a range of movement including at least said predetermined height of said cassette,
a horizontal rotary driver having a pivot axis parallel to said stack axis, and coupled to said arm proximate said second end for selective rotation of said arm about said pivot axis through a range of rotation for movement of said gripper in an arc about said pivot axis including at least a first position where said gripper may grip a substrate disposed in said cassette and a second position where any substrate held by said gripper is clear of said cassette; and
a processing station axially aligned with the cassette at one end thereof and including a single substrate holding location disposed within said range of movement of said vertical driver and within said range of rotation of said horizontal rotary driver.

2. The robotic substrate manipulator as claimed in claim 1, wherein each of the substrates is a circular disk, and wherein:
   each said plurality of substrate holding locations of said cassette includes
      a plurality of fixed holders disposed to engage respective portions of the edge of any substrate disposed in said substrate holding location,
      a movable holder disposed for motion perpendicular to the edge of any substrate disposed in said substrate holding location, and
      a holding spring connected to said movable holder for urging said movable holder toward the edge of any substrate disposed in said substrate holding location,
   whereby a substrate disposed in said substrate holding location is passively retained by said movable holder via said holding spring, and a substrate may be loaded into or removed from said substrate holding location by overcoming said holding spring.

3. The robotic substrate manipulator as claimed in claim 1, wherein:
   said cassette consists of
      a plurality of substrate holding location stacks, and
      a stack movement means connected to said plurality of substrate holding location stacks for moving a selected substrate holding stack to a predetermined location accessible by said manipulator arm assembly.

4. The robotic substrate manipulator as claimed in claim 3, wherein:
   said cassette including
      a circular carousel having said plurality of substrate holding location stacks disposed along the periphery thereof, and
      said stack movement means consists of a carousel motor coupled to said circular carousel for rotary motion of said circular carousel to move a selected substrate holding stack to said predetermined location accessible by said manipulator arm assembly.

5. The robotic substrate manipulator as claimed in claim 4, wherein:
   said cassette further includes
      anti-vibration mounting of said circular carousel.

6. The robotic substrate manipulator as claimed in claim 4:
   wherein said plurality of substrate holding location stacks consist of six substrate holding location stacks disposed at equal distances along the periphery of said carousel.

7. The robotic substrate manipulator as claimed in claim 4, further comprising:
   a circular cylinder having said carousel disposed therein and having an access opening therein at said predetermined location accessible by said manipulator arm assembly.

8. The robotic substrate manipulator as claimed in claim 1, further comprising:
   a barrier separating said cassette from said processing station having a processing access opening therein permitting entry of a substrate via said manipulator arm assembly;
   a door disposed at said processing access opening of said barrier; and
   a door operator coupled to said door for moving said door between a closed position covering said processing access opening and an opened position permitting manipulator arm assembly access to said processing station.

9. The robotic substrate manipulator as claimed in claim 8, further comprising:
   a vacuum chamber enclosing said cassette and said manipulator arm assembly, said vacuum chamber including said barrier and said door whereby when said door is closed vacuum may be maintained at said plurality of substrate holding locations; and
   said processing station is vented to the external environment.

10. The robotic substrate manipulator as claimed in claim 9, wherein:
   said door operator includes passive means for retaining said door in said closed position.

11. The robotic substrate manipulator as claimed in claim 10, wherein:
   said passive means of said door operator for retaining said door in said closed position includes a compound lever capable of cam over and a stop limiting the range of movement of said compound lever past cam over.

12. The robotic substrate manipulator as claimed in claim 1, wherein:
   said gripper includes a pair of opposed fingers, at least one finger spring for urging said opposed fingers closed, and a solenoid disposed to open said opposed fingers when energized.

13. The robotic substrate manipulator as claimed in claim 12, wherein:
   said solenoid comprises a fixed solenoid coil and an armature movable in response to energization of the solenoid coil;
   the at least one spring coupled to the armature for urging the armature in a direction opposing movement by the energization of the solenoid coil; and
   link means for coupling the armature to the fingers for opening the fingers when the armature moves in response to coil energization and for urging the fingers closed under spring force.

14. The robotic substrate manipulator as claimed in claim 1, wherein:
   said vertical driver includes
      an external screw disposed on a line parallel to said at least one stack axis,
      a mating internal screw disposed on said arm to engage said external screw, and
      a vertical drive motor disposed for bidirectional rotation of said external screw to move said arm up and down parallel to said at least one stack axis.

15. The robotic substrate manipulator as claimed in claim 14, wherein:
   said vertical driver further includes
      a vertical position gauge for indicating the vertical position of said arm.

16. The robotic substrate manipulator as claimed in claim 15, wherein:
   said vertical position gauge includes a rotary encoder coupled to said vertical drive motor.

17. The robotic substrate manipulator as claimed in claim 14, wherein:
   said horizontal rotary driver includes
      a first gear disposed for rotation about said pivot axis having said external screw disposed thereon,
      a second gear engaging said first gear, and a horizontal drive motor coupled for bidirectional rotation of said second gear to rotate said arm about said pivot axis.

18. The robotic substrate manipulator as claimed in claim 17, wherein:
said horizontal rotary driver further includes
a horizontal rotary position gauge for indicating the rotary position of said arm.

19. The robotic substrate manipulator as claimed in claim 18, wherein:
said horizontal rotary position gauge includes a rotary encoder coupled to said vertical drive motor.

20. The robotic substrate manipulator as claimed in claim 14, wherein
said horizontal rotary driver includes
a cam having a cam surface with first, second and third cam faces,
a cam follower disposed to follow said cam surface of said cam,
a lever arm coupled to said cam follower and said arm for rotation of said arm about said pivot axis, and
a horizontal drive motor coupled for bidirectional rotation of said cam to rotate said arm about said pivot axis, whereby said arm is rotated to a first position with any substrate held by said gripper clear of said cassette when said cam follower rests on said first cam face, said arm is rotated to a second position for accessing a substrate in said cassette when said cam follower rests on said second cam face, and said arm is rotated to a third position for accessing a substrate in said processing station when said cam follower rests on said third cam face.

21. The robotic substrate manipulator as claimed in claim 1, further comprising:
a force detector disposed on said manipulator arm for detecting insertion force on any substrate held in said gripper.

22. The robotic substrate manipulator as claimed in claim 21, wherein:
said force detector is disposed to measure the torque on a shaft of said horizontal drive motor.

23. The robotic substrate manipulator as claimed in claim 1, wherein:
said processing station further includes a heater disposed to heat any substrate disposed in said single substrate holding location.

24. The robotic substrate manipulator as claimed in claim 1, wherein:
said single substrate holding location includes
a plurality of spring holders disposed to engage respective portions of the edge of any substrate disposed in said single substrate holding location, and
a gripper notch disposed in the periphery of said single substrate holding location for accommodating a portion of said gripper during loading and unloading of said single substrate holding location;
whereby a substrate disposed in said single substrate holding location is passively retained by said plurality of spring holders, and a substrate may be loaded into or removed from said single substrate holding location by overcoming said plurality of spring holders.

25. The robotic substrate manipulator as claimed in claim 1, wherein:
said robotic substrate manipulator is adapted to be disposed in a vacuum.

26. The robotic substrate manipulator as claimed in claim 25, wherein:
said robotic substrate manipulator is constructed of low offgassing materials.

27. The robotic substrate manipulator as claimed in claim 26, wherein:
said robot substrate manipulator is constructed without lubricants.

28. The robotic substrate manipulator as claimed in claim 26, wherein:
said robotic substrate manipulator is constructed with nonhydrocarbon lubricants.

29. The robotic substrate manipulator as claimed in claim 1, wherein:
said single substrate holding location includes
a plurality of spring holders disposed about a holder axis to engage respective portions of the edge of any substrate disposed in said single substrate holding location, and
means for rotating the spring holders about the holder axis;
whereby a substrate disposed in said single substrate holding location is passively retained by said plurality of spring holders for rotation within the holding locations, and a substrate may be loaded into or removed from said single substrate holding location by overcoming said plurality of spring holders.

30. The robotic substrate manipulator as claimed in claim 29, wherein:
said single substrate holding location includes a heater mounted adjacent the spring holders and disposed to heat any substrate disposed in said single substrate holding location.

31. The robotic substrate manipulator as claimed in claim 29, wherein:
said single substrate holding location includes a heater mounted on the means for rotating the spring holders for rotation therewith and disposed to heat any substrate disposed in said single substrate holding location.

32. A robotic substrate manipulator comprising:
a cassette including
a circular carousel having a plurality of substrate holding location stacks disposed along the periphery thereof, each substrate holding location stack having a plurality of substrate holding locations disposed in a stacked relationship having a predetermined height along a corresponding stack axis, each substrate holding location capable of holding a single substrate,
said carousel capable of rotary motion to move a selected substrate holding stack to a predetermined location;
a circular cylinder having said carousel disposed therein and having an access opening therein at said predetermined location accessible by a two-axis manipulator arm assembly;
a processing station including a single substrate holding location axially aligned with the carousel;
the said two-axis manipulator arm assembly including
an arm having a first end with a gripper including a pair of opposed fingers, at least one finger spring for urging said opposed fingers closed, and a solenoid disposed to open said opposed fingers when energized, said arm having a second end opposite to said first end, a vertical driver coupled to said arm proximate to said second end for selective movement of said arm parallel to said stack axis through a range of movement encompassing the single substrate location and the substrate holding locations, a horizontal rotary driver having a pivot axis parallel to said stack axis, and coupled to said arm proximate said second end for selective rotation of said arm about said pivot axis through a range of rotation including at least a first position where said gripper may grip a substrate disposed in said cassette and a second position where any substrate held by said gripper is clear of said cassette and a third position where a substrate held by the gripper is disposed in the single substrate holding location;

a barrier separating said cassette from said processing station having a processing access opening therein permitting entry of a substrate via said manipulator arm assembly;

a door disposed at said processing access opening of said barrier;

a door operator coupled to said door for moving said door between a closed position covering said processing access opening and an opened position permitting manipulator arm assembly access to said processing station.

33. The robotic substrate manipulator as claimed in claim 32, wherein:

said vertical driver includes an external screw disposed on a line parallel to said at least one stack axis, a mating internal screw disposed on said arm to engage said external screw, and a vertical drive motor disposed for bidirectional rotation of said external screw to move said arm up and down parallel to said at least one stack axis, a vertical position gauge for indicating the vertical position of said arm; and said horizontal rotary driver includes a first gear disposed for rotation about said pivot axis having said external screw disposed thereon, a second gear engaging said first gear, a horizontal drive motor coupled for bidirectional rotation of said second gear to rotate said arm about said pivot axis, and a horizontal rotary position gauge for indicating the rotary position of said arm.

34. The robotic substrate manipulator as claimed in claim 32, further comprising:

a vacuum chamber enclosing said cassette and said manipulator arm assembly, said vacuum chamber including said barrier and said door whereby when said door is closed vacuum may be maintained at said plurality of substrate holding locations; and said processing station is vented to the external environment.

35. The robotic substrate manipulator as claimed in claim 34, wherein:

said door operator includes passive means for retaining said door in said closed position.

36. The robotic substrate manipulator as claimed in claim 35, wherein:

said passive means of said door operator for retaining said door in said closed position includes a compound lever capable of cam over and a stop limiting the range of movement of said compound lever past cam over.

37. The robotic substrate manipulator as claimed in claim 32, wherein:

said robotic substrate manipulator is constructed of low offgassing materials.

38. The robotic substrate manipulator as claimed in claim 37, wherein:

said robotic substrate manipulator is constructed without lubricants.

39. The robotic substrate manipulator as claimed in claim 37, wherein:

said robotic substrate manipulator is constructed with nonhydrocarbon lubricants.

* * * * *